United States Patent [19]

Fattaruso et al.

[11] Patent Number: 4,933,644
[45] Date of Patent: Jun. 12, 1990

[54] COMMON-MODE FEEDBACK BIAS GENERATOR FOR OPERATIONAL AMPLIFIERS

[75] Inventors: John W. Fattaruso, Dallas, Tex.; Venugopal Gopinathan, New York, N.Y.

[73] Assignee: Texas Instruments, Incorporated, Dallas, Tex.

[21] Appl. No.: 289,351

[22] Filed: Dec. 23, 1988

[51] Int. Cl.$^5$ .............................................. H03F 3/45
[52] U.S. Cl. .................................... 330/258; 330/253
[58] Field of Search ............... 330/252, 253, 258, 259, 330/260, 277

[56] References Cited

U.S. PATENT DOCUMENTS 4,105,942  8/1978  Henry .............................. 330/258 X
4,568,885  2/1986  McKenzie et al. .............. 330/258 X

OTHER PUBLICATIONS

"High–Frequency CMOS Continuous–Time Filters," by Khorramabadi and Gray, *IEEE Journal of Solid-State Circuits*, vol. SC-19, No. 6, Dec. 1984, pp. 939–948.
"A High–Performance Micropower Switched-Capacitor Filter", by Castello and Gray, *IEEE Journal of Solid–State Circuits*, vol. SC-20, No. 6, Dec. 1985, pp. 1122–1132.
"A Family of Differential NMOS Analog Circuits for a PCM Codec Filter Chip," by Senderowicz et al., *IEEE Journal of Solid–State Circuits*, vol. SC-17, No. 6, Dec. 1982, pp. 1014–1023.

*Primary Examiner*—Steven Mottola
*Attorney, Agent, or Firm*—Stanton C. Braden; Rodney M. Anderson; Melvin Sharp

[57] ABSTRACT

A common-mode feedback circuit comprises a reference generator (12) for generating a signal corresponding to a desired common-mode operating point connected to a common-mode bias circuit (14) for generating a second signal corresponding to the common-mode operating point of the outputs ($V_{out}^+$, $V_{out}^-$) of the fully differential operational amplifier. In the preferred embodiment, the common-mode bias circuit (14) includes a sensing circuit (58) comprising two MOS transistors (60, 62) having sources and drains connected together. The MOS transistors (60, 62) operate in the ohmic region to provide a variable load responsive to the output signals ($V_{out}^+$, $V_{out}^-$) connected to their gates.

14 Claims, 5 Drawing Sheets

COMMON-MODE FEEDBACK BIAS GENERATOR FOR OPERATIONAL AMPLIFIERS

TECHNICAL FIELD OF THE INVENTION

This invention pertains in general to integrated circuits and particularly to fully differential operational amplifiers.

BACKGROUND OF THE INVENTION

As MOS technologies become smaller, the power supply voltages must be lowered. However, analog circuits designed from the smaller technologies must process signals of the same amplitude, requiring a similar dynamic range in spite of the lower supply voltages. In order to provide this dynamic range, circuit designs often employ fully differential operational amplifiers.

A fully differential operational amplifier has two inputs ($V_{in}+$ and $V_{in}-$) and two output voltages ($V_{out}+$ and $V_{out}-$). The output voltages ideally are symmetrical about a common-mode output voltage ($V_{cmo}$). However, no information about the common-mode output voltage is fed back to the inputs in a typical fully differential amplifier. The common-mode output voltage is very sensitive to voltage perturbations and environmental changes.

One approach to the common-mode bias problem is the use of a switched-capacitor circuit. While this circuit sufficient in some applications, it requires a reset period for every clock cycle. Hence, it is inappropriate for applications such as continuous time filters where a reset period is not always available.

Another solution has been to design the output stage of the operational amplifier with parallel MOS devices operating in the ohmic region in a feedback loop designed to adjust the output voltages in accordance with a common-mode bias imbalance. However, this design sufficiently limits the output voltage swing of the output stage and exhibits limited loop gain. This presents a problem as the power supply voltages become smaller with improved technology. As a result, the precision with which the common-mode output bias point can be set is poor.

Therefore, a need has arisen in the industry for a fully differential operational amplifier design allowing precise setting of the common-mode output bias point without limiting the output voltage swing of the amplifier.

SUMMARY OF THE INVENTION

In accordance with the present invention, a common-mode feedback circuit and method is provided which substantially eliminates problems associated with fully differential operational amplifiers. The common-mode feedback circuit of the present invention comprises circuitry to generate a first signal corresponding to a desired common-mode voltage and circuitry to generate a second signal corresponding to the common-mode operating point of the fully differential operational amplifier. The common-mode operating point of the fully differential operational amplifier is adjusted based on a comparison of the first and second signals. The circuitry to generate a second signal comprises a circuit that provides a variable conductance element responsive to the common-mode operating point of the operational amplifier output.

The present invention provides several advantages over the prior art. The operational feedback circuit may be design with a high loop gain in order to accurately place the common-mode operating point of the operational amplifier. Importantly, the circuitry to generate the second signal does not load the amplifier output terminals and reduce amplifier gain. Further, the desired operating point may be easily designed into the circuit. Additionally, the circuit allows continuous time operation of the feedback circuit.

In a second aspect of the present invention, the circuitry to generate a second signal comprises two MOS transistors having respective sources and drains connected together and gates connected to the differential outputs of the operational amplifier. The MOS transistor pair is designed to operate in the ohmic region, such that it acts as a variable conductance element responsive to the common-mode operating point of the differential outputs. The circuitry to generate a first signal comprises a second MOS transistor pair having gates connected to predetermined voltages. This aspect of the invention provides a variable conductance element which operates under continuous time operations.

BRIEF DESCRIPTION OF THE DRAWINGS

For a more complete understanding of the present invention and the advantages thereof, reference is now made to the following description now taken in conjunction with the accompanying drawings in which:

FIG. 5b illustrates a circuit diagram of a feedforward path used in conjunction with the common-mode feedback circuit of FIG. 5a.

DETAILED DESCRIPTION OF THE INVENTION

Figure 1:
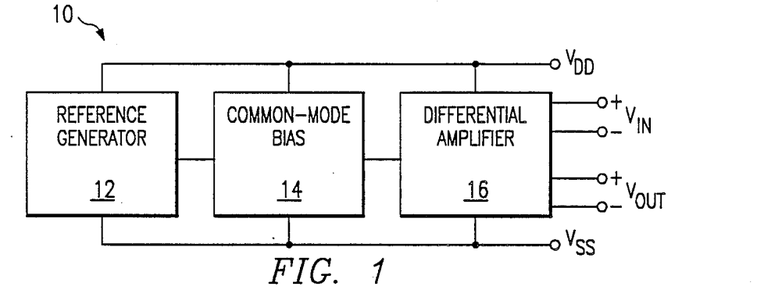
FIG. 1 illustrates a block diagram of the common-mode feedback amplifier circuit of the present invention.

The preferred embodiment of the present invention is best understood by referring to FIGS. 1–5 of the drawings, like numerals being used for like and corresponding parts of the various drawings FIG. 1 illustrates a block diagram of the operational amplifier of the present invention. The operational amplifier, generally referred to by reference 10, comprises a reference generator 12 connected to a common-mode bias circuit 14. The common-mode bias circuit 14 is connected to a differential amplifier 16. The reference generator 12, common-mode bias circuit 14 and differential amplifier 16 are connected to the chip voltage supplies $V_{DD}$ and $V_{SS}$. The differential amplifier 16 receives input signals $V_{in}+$ and $V_{in}-$ and produces output signals $V_{out}+$ and $V_{out}-$.

In operation, the common-mode bias circuit compares a signal provided by the reference generator 12 to the common-mode operating point of the differential amplifier 16. The common-mode bias circuit produces a signal to adjust the common-mode operating point of the differential amplifier 16 to a level determined by the reference generator 12.

Figure 2A:
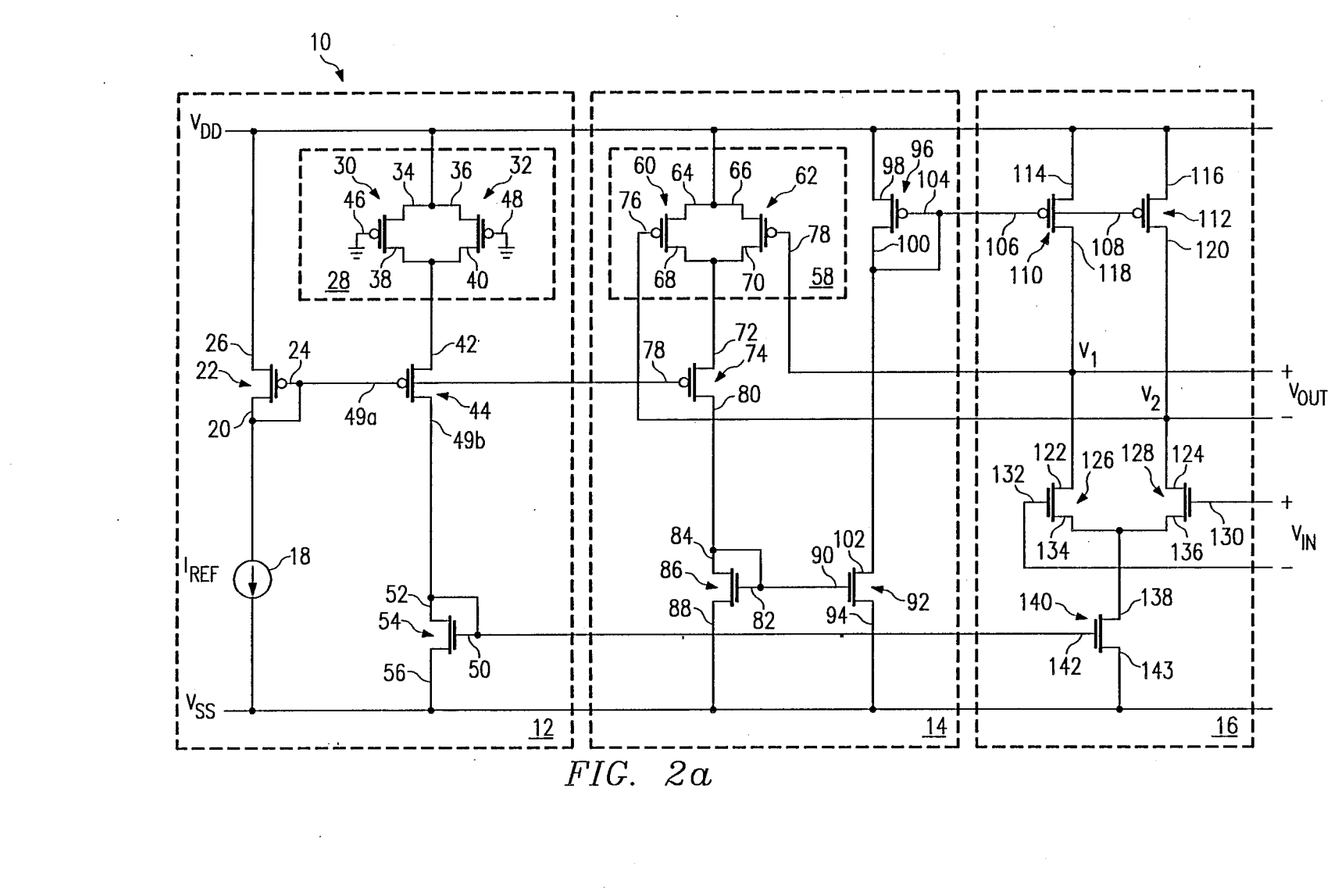
FIG. 2a illustrates a circuit diagram of a first embodiment of the common-mode feedback amplifier circuit of the present invention.

FIG. 2a illustrates a circuit diagram of a first embodiment of the present invention. The reference generator 12 comprises a reference current source 18 connected between $V_{SS}$ and a first source/drain 20 of a P channel transistor 22. The gate 24 of the P channel transistor 22 is connected to the first source/drain 20 and the second source/drain 26 of the P channel transistor 22 is connected to $V_{DD}$. A common-mode reference circuit 28 comprises two P channel transistors 30 and 32. The P channel transistors 30 and 32 have respective first source/drains 34 and 36 and second source/drains 38 and 40 connected together. The first source/drains 34 and 36 are connected to $V_{DD}$ and the second source/drains 38 and 40 are connected to a first source/drain 42 of a P channel transistor 44. The gates 46 and 48 of the P channels transistors 30 and 32 are connected to a predetermined voltage, illustrated in FIG. 2a as ground voltage. The gate 49a of P channel transistor 44 is connected to the gate of P channel transistor 22 and the second source/drain 49b of P channel transistor 44 is connected to the gate 50 and first source/drain 52 of an N channel transistor 54. The second source/drain 56 of N channel transistor 54 is connected to $V_{SS}$.

The common-mode bias circuit 14 comprises a sensing circuit 58 formed by two P channel transistors 60 and 62. The first source/drains 64 and 66 of the P channel transistor 60 and 62 are connected to $V_{DD}$ and the second source/drains 68 and 70 are connected to a first source/drain 72 of a P channel transistor 74. The gate 76 of P channel transistor 60 is connected to a node $V_2$ which is in turn connected to the $V_{out}^-$ terminal. The gate 78 of P channel transistor 62 is connected to a node $V_1$ which is connected to the $V_{out}^+$ terminal. The gate of P channel transistor 74 is connected to gates 49a and 24 of P channel transistors 44 and 22, respectively. The second source/drain 80 of P channel transistor 74 is connected to the gate 82 and first source/drain 84 of an N channel transistor 86. The second source/drain 88 of N channel transistor 86 is connected to $V_{SS}$. The gate 82 of N channel transistor 86 is connected to the gate 90 of N channel transistor 92. A first source/drain 94 of N channel transistor 92 is connected to $V_{SS}$. A P channel transistor 96 has a first source/drain region 98 connected to $V_{DD}$ and a second source/drain region 100 connected to the second source/drain 102 of N channel transistor 92. The gate 104 of the P channel transistor 96 is connected to the second source/drain 100 of P channel transistor 96.

The differential amplifier 16 includes P channel transistors 110 and 112 having gates 106 and 108 connected to the gate 104 and second source/drain 100 of P channel transistor 96. First source/drains 114 and 116 of P channel transistors 110 and 112, respectively, are connected to $V_{DD}$. Second source/drains 118 and 120 of P channel transistors 110 and 112 are connected respectively to the first source/drains 122 and 124 of N channel transistors 126 and 128 and to nodes $V_1$ and $V_2$. The gate 130 of N channel transistor 128 is connected to the $V_{in}^+$ terminal and the gate 132 of N channel transistor 126 is connected to the $V_{in}^-$ terminal. The second source/drains 134 and 136 of N channel transistors 126 and 128 are connected to the first source/drain 138 of N channel transistor 140. The gate 142 of N channel transistor 140 is connected to the gate 50 of N channel transistor 54. The second source/drain 143 of N channel transistor 140 is connected to $V_{SS}$.

It can be shown that the current through two MOS transistors connected in parallel such as P channel transistors 60 and 62 is dependent only upon the common-mode voltage applied to their gates and not upon the differential mode voltage at their gates, so long as the transistor pair remains in the ohmic region. Using FIG. 2a as an example, the current into source/drain 72 of transistor 74 is dependent upon the average of the voltages at gates 60 and 62 (i.e, $(V_1+V_2)/2$) and not upon the difference of the gate voltages. Therefore, the sensing circuit 58 looks like a single MOS device in the ohmic region with a gate voltage equal to $(V_1+V_2)/2$), so long as the transistors 60 and 62 remain in the ohmic region. To the first order, there is no dependence on the differential mode signal.

Figure 2B:
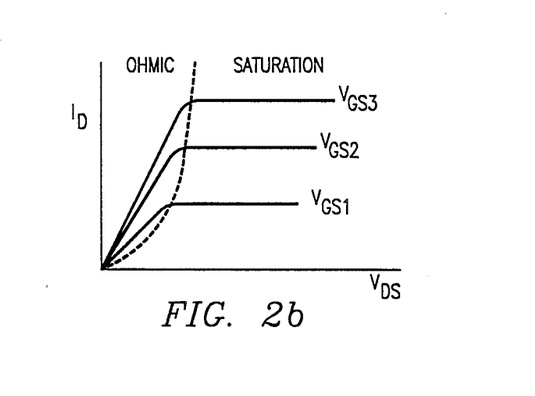
FIG. 2b illustrates a diagram showing characteristic curves for a typical MOS transistor.

FIG. 2b illustrates characteristic curves for a MOS transistor. In the ohmic region, the drain current of the transistor is substantially proportional to the voltage across the drain and source. In saturation, the drain current remains substantially the same as the drain to source voltage varies. A transistor is in the ohmic region when its drain to source voltage is less than or equal to its gate source voltage minus the threshold voltage.

In operation, the current flowing through P channel transistor 74 is mirrored by N channel transistors 86 and 92 and P channel transistors 96, 110 and 112. As the common-mode output voltage, $(V_1+V_2)/2$), increases, the current through the sensing circuit 58 decreases. Hence, the differential pair load currents, i.e., the currents through P channel transistors 110 and 112 decrease when the common-mode output voltage increases and will increase when the common-mode output voltage decreases.

The current through P channel transistor 44, and hence the current through reference circuit 28, is mirrored by transistors 54 and 140. If the ratio of device constants ($K_{54}$ and $K_{140}$) of the transistors 54 and 140 are such that $$K_{140}/K_{54} = 2 * K_{92}/K_{86} * K_{110}/K_{96}$$

and if $$K_{112} = K_{110}$$

(where the subscript to the device constant K refers to the reference numeral of the transistor) then equilibrium will be reached when the common-mode output voltage $(V_1+V_2)/2$ equals the common-mode voltage fed to the gates of P channel transistors 30 and 32. In the illustrated circuit, the gate voltages to transistors 30 and 32 are set to ground; however, the gate voltages could be set to predetermined voltages in order to obtain any desired common-mode voltage For example, if the voltage supplies were at zero and five voltages, it may be desirable to set the gate voltage of the transistors 30 and 32 at 2.5 volts.

The mirror gains $K_{92}/K_{86}$ and $K_{92}/K_{96}$ could be made large to produce a large common-mode loop gain and hence, the common-mode output operating point precisely.

The circuit of FIG. 2a provides significant advantages over the prior art. The circuit provides common-mode feedback with continuous time operation. Further, a high loop gain is provided to accurately control the common-mode output point.

The circuit of FIG. 2a does have some limitations. First, if the output voltages $V_1$ or $V_2$ became high enough, the transistors 60 and 62 would be taken out of the ohmic region and the immunity to differential mode signals would suffer. Further, where high loop gains are required, the phase shift due to parasitic capacitance at the drains of transistors 74 and 92 may be excessive, and compensation may be required.

Figure 3:
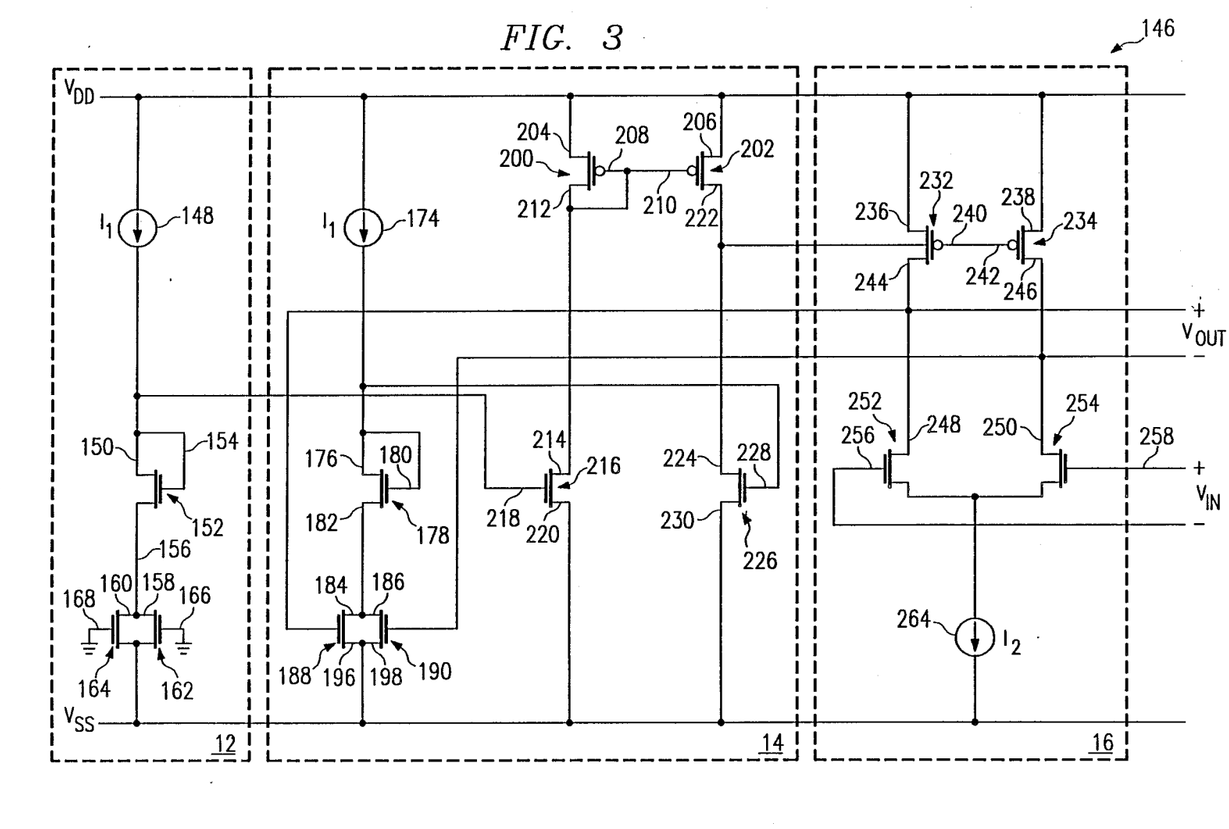
FIG. 3 illustrates a circuit diagram of a second embodiment of the common-mode feedback amplifier of the present invention.

FIG. 3 illustrates a circuit diagram of a second embodiment of the present invention. The operational amplifier circuit 146 includes a reference generator 12 comprising a current source 148 connected between $V_{DD}$ and a source/drain 150 of an N channel transistor 152. The gate 154 of N channel transistor 152 is connected to the first source/drain 150. The second source/drain of N channel transistor 152 is connected to the first source/drains 158 and 160 of respective N channel transistors 162 and 164. The gates 166 and 168 of the respective N channel transistors 162 and 164 are connected to a predetermined voltage, shown in FIG. 3 as ground voltage. The second source/drains 170 and 172 of transistors 162 and 164 are connected to $V_{SS}$.

A second current source 174 is connected between $V_{DD}$ and a first source/drain 176 of an N channel transistor 178. The gate 180 of the N channel transistor 178 is connected to the source/drain 176. The second source/drain 182 of the N channel transistor 178 is connected to first source/drains 184 and 186 of respective N channel transistors 188 and 190. The respective gates 192 and 194 of N channel transistors 188 and 190 are connected to $V_{out}{}^+$ and $V_{out}{}^-$. Second source/drains 196 and 198 are connected to $V_{SS}$.

P channel transistors 200 and 202 have first source/drains 204 and 206 connected to $V_{DD}$ and gates connected to the second source/drain 212 of P channel transistor 200. The second source/drain 212 is also connected to a first source/drain 214 of N channel transistor 216. The gate 218 of N channel transistor 216 is connected to the first source/drain 150 of N channel transistor 152. The second source/drain 220 of N channel transistor 216 is connected to $V_{SS}$. The second source/drain 222 of P channel transistor 202 is connected to a first source/drain 224 of N channel transistor 226. The gate 228 of N channel transistor 226 is connected to the first source/drain 176 of N channel transistor 178. The second source/drain 230 of N channel transistor 226 is connected to $V_{SS}$. P channel transistors 232 and 234 have respective first source/drains 236 and 238 connected to $V_{DD}$. The gates 240 and 242 of P channel transistors 232 and 234 are connected to the second source/drain 222 of P channel transistor 202. Second source/drains 244 and 246 of transistors 232 and 234 are connected to respective first source/drains 248 and 250 of N channel transistors 252 and 254. The gates 256 and 258 of N channel transistors 252 and 254 are connected to $V_{in}{}^+$ and $V_{in}{}^-$, respectively. The second source/drains 260 and 262 of the N channel transistors 248 and 250 are connected to a third current source 264. The current source 264 is connected to $V_{SS}$.

In operation, the circuit of FIG. 3 uses a differential pair formed by N channel transistors 216 and 226 and a differential-to-single-ended conversion formed by transistors 200 and 202 in order to amplify the differences in voltages across the effective resistances at the transistor pairs formed by transistors 190 and 188 and transistors 164 and 162. If the drain to source conductance of the process forming the transistors is low, large loop gains may be produced and the common-mode output operating point may be set very precisely. If the device constants for the transistors 190 and 188 can be increased, the potential at the drains of the transistors 190 and 188 will be decreased and a larger output voltage swing is allowable before the transistors 190 and 188 will be taken out of the ohmic region.

Figure 4:
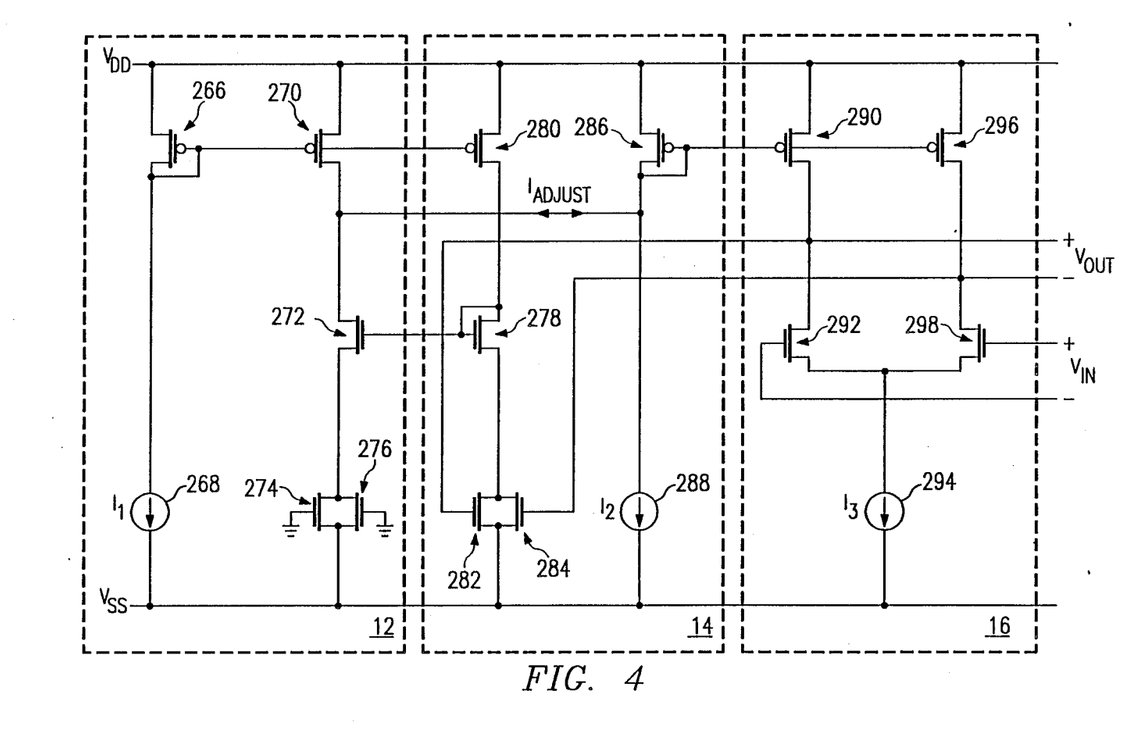
FIG. 4 illustrates a circuit diagram of a third embodiment of the common-mode feedback amplifier circuit of the present invention.

FIG. 4 illustrates a circuit diagram of a third embodiment of the present invention. A P channel transistor 266 having a first source/drain connected to $V_{DD}$, a second source/drain connected to a current source 268 and a gate tied to its second source/drain. The current source 268 is connected between the second source/drain of transistor 266 and $V_{SS}$. A P channel transistor 270 has a first source/drain connected to $V_{DD}$, a gate connected to the gate of transistor 266 and a second source/drain connected to a first source/drain of N channel transistor 272. The second source/drain of transistor 272 is connected to a transistor pair comprising N channel transistors 274 and 276. The second source/drains of transistors 274 and 276 are connected to $V_{SS}$ and the gates of transistors 274 and 276 are connected to predetermined voltages, shown in FIG. 4 as ground. The gate of transistor 272 is connected to the gate and first source/drain of an N channel transistor 278. The gate of transistor 278 is also connected to a first source/drain of P channel transistor 280 which has a gate connected to the gates of transistors 266 and 270 and a second source/drain connected to $V_{DD}$. The second source/drain of transistor 278 is connected to the first source/drains of N channel transistors 282 and 284. The gate of N channel transistor 282 is connected to $V_{out}{}^+$ and the gate of N channel transistor 284 is connected to $V_{out}{}^-$. The second source/drains of transistors 282 and 284 are connected to $V_{SS}$.

An N channel transistor 286 has a first source/drain connected to $V_{DD}$ and a gate connected to its second source/drain. The gate of transistor 286 is also connected between the second source/drain of transistor 270 and the first source/drain of transistor 272 and to a current source 288. The current source 288 is also connected to $V_{SS}$.

An N channel transistor 290 has a first source/drain connected to $V_{DD}$, a gate connected to the gate of transistor 286, and a second source/drain connected to $V_{out}{}^+$. A transistor 292 has a first source/drain connected to the second source/drain of transistor 290, a gate connected to $V_{in}{}^-$ and a second source/drain connected to a current source 294. A P channel transistor 296 has a first source/drain connected to $V_{DD}$, a gate connected to the gates of transistors 286 and 290, and a second source/drain connected to $V_{out}{}^-$. The second source/drain of transistor 296 is also connected to a first source/drain of N channel transistor 298. The transistor 298 has a gate connected to $V_{in}{}^+$ and a second source/drain connected to the second source/drain of transistor 292 to current source 294. The current source 294 is also connected to $V_{SS}$. Current source 330 drives the same current as current source 288.

In the circuit of FIG. 4, the current in the load devices 290 and 296 is primarily set by the current source 288, but can be adjusted by the current $I_{adjust}$. The current $I_{adjust}$ is developed by the current difference between the second source/drain of transistor 270 and the first source/drain of transistor 272. The current difference between transistors 270 and 272 is controlled by the effective ohmic resistance of transistors 282 and 284, which are part of the resistance-degenerated current mirror formed by transistors 272 and 278. The resistance at transistors 282 and 284 is dependent only upon the common-mode output voltage (to the first order) as previously described.

This circuit has the advantage of only one moderate impedance node (at the drain of transistor 286) in the common-mode feedback path, and therefore is able to achieve a higher frequency response.

Figure 5A:
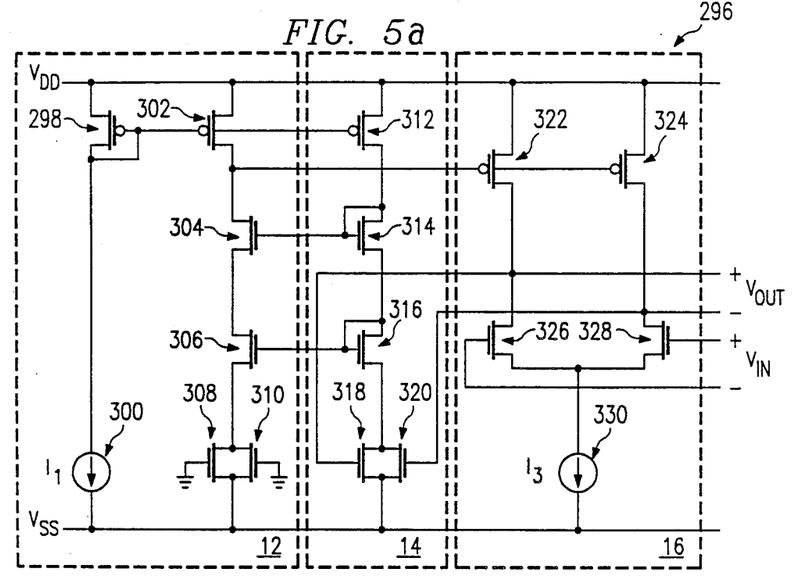
FIG. 5a illustrates a circuit diagram of a fourth embodiment of the common-mode feedback amplifier circuit of the present invention.

FIG. 5 illustrates a circuit diagram of a fourth embodiment of the present invention having a higher loop gain for increased precision in setting the common-mode operating point. The common-mode feedback circuit 296 comprises a P channel transistor 298 having a first source/drain connected to $V_{DD}$ and a gate connected to a second source/drain and to a first current source 300. The current source 300 is also connected to $V_{SS}$. A P channel transistor 302 has a first source/drain connected to $V_{DD}$, a gate connected to the gate of transistor 298 and a second source/drain connected to a first source/drain of N channel transistor 304. N channel transistor 304 has a second source/drain connected to a first source/drain of N channel transistor 306. The second source/drain of transistor 306 is connected to the first source/drain of N channel transistors 308 and 310. The gates of transistors 308 and 310 are connected to predetermined voltages, illustrated as ground voltage. The second source/drains of transistor 308 and 310 are connected to $V_{SS}$. A P channel transistor 312 has a first source/drain connected to $V_{DD}$ and a gate connected to the gates of transistors 302 and 298. The second source/drain of transistor 312 is connected to the first source/drain and gate of an N channel transistor 314. The gate transistor 314 is also connected the gate of transistor 304. The second source/drain of transistor 314 is connected to the first source/drain and gate of an N channel transistor 316. The gate of transistor 316 is also connected to the gate of transistor 306. The second source/drain of transistor 316 is connected to the first source/drains of N channel transistors 318 and 320. The gates of N channel transistors 318 and 320 are connected to $V_{out}+$ and $V_{out}-$, respectively. The second source/drains of transistors 318 and 320 are connected to $V_{SS}$.

P channel transistors 322 and 324 have first source/drain regions connected to $V_{DD}$ and gates connected between the second source/drain of transistor 302 and the first source/drain of transistor 304. The second source/drains of transistors 322 and 324 are connected to $V_{out}+$ and $V_{out}-$, respectively. First source/drains of transistors 326 and 328 are connected to $V_{out}+$ and $V_{out}-$, respectively, and their gates are connected to $V_{in}-$ and $V_{in}+$, respectively. A current source 330 is connected between the second source/drains of transistors 326 and 328 and $V_{SS}$.

The circuit of FIG. 5 provides high loop gain from the common-mode output voltage at the high impedance node at the second source/drain of transistor 302 which is connected to the gates of output transistors 322 and 324. The voltage at the second source/drain of transistor 302 and first source/drain of transistor 304 can swing over a wide range. Since the gates of transistors 322 and 324 (the differential amplifier load) are driven by this node, a high loop gain is obtained. Further, the output voltages of operational amplifier circuit 296 can swing over a wide range without the transistor pair 318 and 320 leaving the ohmic region. Because transistors 318 and 320 are N channel devices with drain voltages near the negative supply rail and the output voltages of the differential amp will be near the positive supply rail, the gates of transistors 318 and 320 will be at a high enough voltage to ensure that $V_{ds} \leq V_{GS} - V_T$. This feature is also present in the circuits of FIGS. 3 and 4. The cascade device 304 keeps the drain to source voltage of transistor 306 very close to the drain to source voltage of transistor 316 to improve the mirror tracking.

The circuit of FIG. 5a has a large loop gain, therefore it is very sensitive to changes in the common-mode operating point and provides for a very precise setting. By contrast, the circuit of FIG. 4 has a smaller loop gain, but is faster than the circuit of FIG. 5.

Figure 5B:
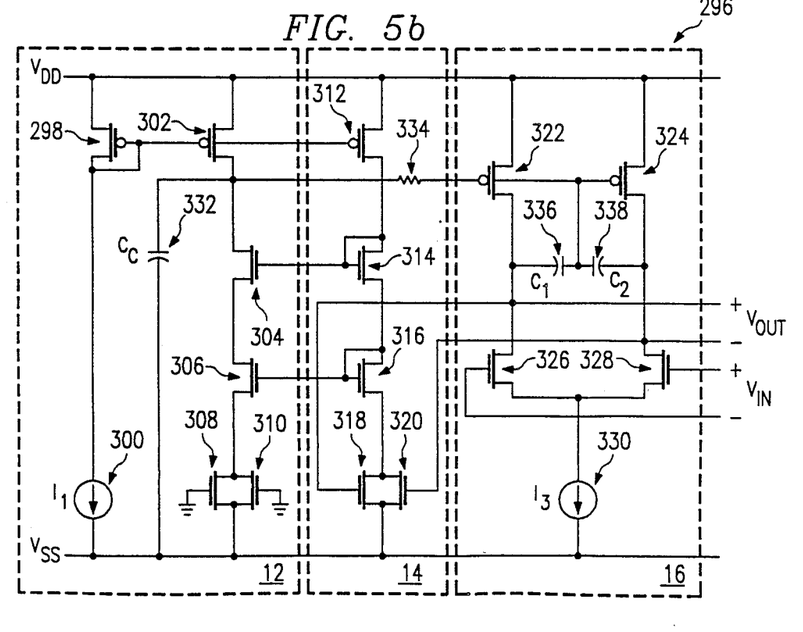

FIG. 5b illustrates a circuit which can be used in connection with the circuit of FIG. 5a to provide a feedforward path around the circuit for high frequency common-mode control. The circuit of FIG. 5b is identical to the circuit of FIG. 5a with the addition of the circuitry described below. A first capacitor 332 is connected between $V_{SS}$ and the second source/drain of transistor 302. A resistor R1 is connected between the second source/drain of transistor 302 and the gates of transistors 322 and 324. Capacitors 336 and 338 are connected in serial between the second source/drains of transistors 322 and 324, and hence, between the voltage output nodes $V_{out}+$ and $V_{out}-$. The gate of transistor 324 is connected to a node between the capacitors 336 and 338.

In operation, the capacitors 336 and 338 provide a feedforward path at high frequencies between the operational amplifier common-mode output voltage and the bias generator output terminal. The capacitor 332 introduces a dominant pole for compensation of the bias generator feedback loop. The resistor 334 is designed so that the high frequency path becomes active as the compensation pole provided by capacitor 332 rolls off the loop gain. The feedforward path through 336 and 338 will stabilize the common-mode operating point of the differential amplifier at high frequencies by diode connecting transistors 322 and 324, but for common mode signals only. For differential mode signals, capacitors 336 and 338 act only as a slight additional capacitive load.

Although the present invention has been described in detail, it should be understood that various changes, substitutions and alterations can be made herein without departing from the spirit and scope of the invention as defined by the appended claims.

What is claimed is:

1. A common-mode feedback circuit for use in a fully differential operation amplifier comprising:
    circuitry to generate a first signal corresponding to a desired common-mode voltage;
    circuitry to generate a second signal corresponding to the common-mode operating point of the output of the fully differential operational amplifier; and
    circuitry to adjust the common-mode operating point of the output of the fully differential operational amplifier based on a comparison of said first and second signals,
    wherein said circuitry to generate a second signal comprises circuitry to provide a variable current responsive to the common-mode operating point of the output of the fully differential operational amplifier.

2. A common-mode feedback circuit for use in a fully differential operational amplifier comprising:
  circuitry to generate a first signal corresponding to a desired common-mode voltage;
  circuitry to generate a second signal corresponding to the common-mode operating point of the output of the fully differential operational amplifier; and
  circuitry to adjust the common-mode operating point of the output of the fully differential operational amplifier based on a comparison of said first and second signals,
  wherein said circuitry to generate a second signal comprises circuitry to provide a variable resistance responsive to the common-mode operating point of the output of the fully differential operational amplifier.

3. The common-mode feedback circuit of claim 2 wherein said circuit to provide a variable resistance comprises a MOS transistor pair having gates connected to the differential output of the fully differential operational amplifier.

4. The common-mode feedback circuit of claim 3 and further comprising circuitry to maintain the source-drain voltage of said transistor pair such that the current characteristics of the transistor pair remains in the ohmic region.

5. An operational amplifier comprising:
  differential amplifier circuitry including input nodes for receiving a differential input and output circuitry connected to said input nodes for providing a differential output signal to first and second output nodes responsive to said differential input;
  detection circuitry connected to said differential amplifier circuitry for producing a first signal corresponding to the common-mode operating point of said differential output signal,
  said detection circuitry comprising a variable conductance element responsive to the common-mode operating point of said output circuitry;
  reference circuitry connected to said detection circuitry for providing a second signal corresponding to a desired common-mode operating point having a well known relationship with said first signal; and
  compare circuitry for providing a third signal to said output circuitry for indicating a mismatch between said first and second signals.

6. The operational amplifier of claim 5 wherein said variable conductance element comprises two MOS transistors having respective sources and drains connected together and gates connected to the differential output signals.

7. An operational amplifier comprising:
  differential amplifier circuitry including input nodes for receiving a differential input and output circuitry connected to said input nodes for providing a differential output signal to first and second output nodes responsive to said differential input;
  detection circuitry connected to said differential amplifier circuitry for producing a first signal corresponding to the common-mode operating point of said differential output signal;
  reference circuitry connected to said detection circuitry providing a second signal corresponding to a desired common-mode operating point having a known relationship with said first signal; and
  compare circuitry for providing a third signal to said output circuitry for indicating a mismatch between said first and second signals,
  said differential amplifier circuitry including load circuitry comprising a pair of MOS transistors having respective first source/drains connected to a predetermined voltage, respective second source/drains connected to said output nodes and gates connected to said compare circuitry.

8. The operational amplifier of claim 7 wherein said compare circuitry comprises:
  current bias circuitry for generating a bias current;
  adjust circuitry for varying said bias current response to said first and second signals; and
  bias voltage circuitry for generating a bias voltage for driving the gates of said MOS transistor, said bias voltage response to said bias current.

9. The operational amplifier of claim 8 wherein said compare circuitry comprises circuitry to adjust said predetermined current responsive to said mismatch between said first and second signals.

10. The operational amplifier of claim 7 wherein said third signal drives the gates of said MOS transistors.

11. A method for providing common-mode feedback for use in a fully differential operational amplifier, comprising the steps of:
  generating a first signal corresponding to a desired common-mode voltage;
  generating a second signal corresponding to the common-mode operating point of the output of the fully differential operational amplifier.
  said step of generating a second signal comprises the step of generating a variable current responsive to the common-mode operating point of the output of the fully differential operational amplifier; and
  adjusting the common-mode operating point of the output of the fully differential operational amplifier based on a comparison of said first and second signals.

12. A method for providing common-mode feedback for use in a fully differential operational amplifier, comprising the steps of:
  generating a first signal corresponding to a desired common-mode voltage;
  generating a second signal corresponding to the common-mode operating point of the output of the fully differential operational amplifier,
  said step of generating a second signal comprising the step of varying a resistance responsive to the common-mode operating point of the output of the fully differential operational amplifier; and
  adjusting the common-mode operating point of the output of the fully differential operational amplifier based on a comparison of said first and second signals.

13. The method of claim 12 wherein said step of varying a resistance comprises the step of driving the gates of a pair of MOS transistors with the differential output of the fully differential operational amplifier.

14. A method of providing common-mode feedback in a fully differential amplifier comprising the steps of:
  receiving a differential input;
  generating a differential output signal responsive to said differential input;
  generating a first signal corresponding to the common-mode operating point of the differential output signal,
  said step of generating a first signal comprising the step of generating a first signal by varying a conductance element responsive to the common-mode operating point of the output circuitry;
  generating second signal corresponding to a desired common-mode operating point having a known relationship with said first signal; and
  adjusting the common-mode operating point of a differential output signal based on said first and second signals.

* * * * *